United States Patent
Gardner et al.

(10) Patent No.: US 11,038,490 B2
(45) Date of Patent: Jun. 15, 2021

(54) ACTIVE GYRATOR CIRCUIT IN ONE-PAIR ETHERNET WITH PODL

(71) Applicant: Analog Devices International Unlimited Company, Limerick (IE)

(72) Inventors: Andrew J. Gardner, Santa Barbara, CA (US); Heath Stewart, Santa Barbara, CA (US); Gitesh Bhagwat, San Diego, CA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/821,577

(22) Filed: Mar. 17, 2020

(65) Prior Publication Data

US 2020/0304106 A1    Sep. 24, 2020

Related U.S. Application Data

(60) Provisional application No. 62/820,252, filed on Mar. 18, 2019.

(51) Int. Cl.
*H04L 12/10* (2006.01)
*H03H 11/50* (2006.01)

(52) U.S. Cl.
CPC ............. *H03H 11/50* (2013.01); *H04L 12/10* (2013.01)

(58) Field of Classification Search
CPC ................................ H03H 11/50; H04L 12/10
USPC ........................................................... 375/257
See application file for complete search history.

(56) References Cited

U.S. PATENT DOCUMENTS

| | | | | |
|---|---|---|---|---|
| 6,025,765 A * | 2/2000 | Brown | ..................... | H03B 5/20 330/254 |
| 9,252,842 B2 | 2/2016 | Mutzabaugh | | |
| 2005/0213275 A1* | 9/2005 | Kitagawa | ............. | H02H 7/1213 361/93.1 |
| 2013/0069165 A1* | 3/2013 | Nedovic | ................ | H03H 11/48 257/369 |

* cited by examiner

*Primary Examiner* — Ted M Wang
(74) *Attorney, Agent, or Firm* — Schwegman Lundberg & Woessner, P.A.

(57) ABSTRACT

A PoDL system uses a gyrator for DC coupling of DC power from a PSE to a wire pair, and/or decoupling DC power from a wire pair for a PD. The gyrators obviate the use of discrete inductors for DC-coupling/decoupling and can be formed as an integrated circuit. The gyrators use a small integrated capacitor and invert and multiply the capacitor effect to emulate an inductor. The gyrators present a high impedance to AC current and a low impedance to DC current. Various gyrator designs, such as positive and negative polarity gyrators, and configurations are disclosed. Gyrators are described with analog current limit and power switch control, so multiple functions are integrated on the same IC chip.

20 Claims, 16 Drawing Sheets

ACTIVE GYRATOR CIRCUIT IN ONE-PAIR ETHERNET WITH PODL

CROSS-REFERENCE TO RELATED APPLICATIONS

This application is based on and claims priority from U.S. Provisional Application Ser. No. 62/820,252, filed Mar. 18, 2019, by Andrew J. Gardner, incorporated herein by reference.

FIELD OF THE INVENTION

The invention relates to Power over Data Lines (PoDL) systems, where DC power and data signals are provided over the same twisted wire pair, and, in particular, to techniques for coupling DC power to the conductors while isolating the DC power from the PHY, and isolating the DC power source from the differential data signals.

BACKGROUND

In a PoDL system, one or more integrated circuits are typically used as a PoDL controller and a differential Ethernet transceiver. The user typically provides external DC-coupling inductors for either coupling DC power to the wire pair or decoupling the DC power for a powered load. By the user having to add and connect the inductors, there is added hardware expense, size, complexity, and fabrication costs.

FIG. 1 is an example of one type of conventional PoDL system to which the present invention will be compared. Although the twisted wire pair 10 would normally be coupled between Power Sourcing Equipment (PSE) and a Powered Device (PD), the figures are simplified to show the circuitry on only one side of the wire pair 10, where the circuitry can either supply DC power or be powered by DC power.

A PHY 12 is typically an integrated circuit. The PHY 12 is a transceiver that typically includes signal conditioning and decoding circuitry for presenting bits to the next stage. The PHY 12 outputs differential data and receives differential data via a conventional Media Dependent Interface (MDI) connector 14 coupled to the wires 16 and 18 of the twisted wire pair 10. Another PHY is coupled to the other end of the wires 16/18. The PHY 12 represents the physical layer in the OSI model (Open Systems Interconnection model). The term PHY is a term of art and is defined by various IEEE standards, depending on the particular application. A digital processor (not shown) is coupled to the PHY 12 for processing the data.

The PHY 12 is connected to the MDI connector 14 via a common mode choke (CMC) 20 and AC coupling capacitors C1 and C2. The polarities of the windings are designated by the dots.

The CMC 20 is an in-line transformer with two windings, where each winding is in series with a wire in the twisted wire pair 10. As shown by the dots on the CMC 20 windings, the windings have the same polarity, so the magnetic fields generated by a differential mode signal are substantially cancelled out. Thus, the CMC 20 presents little inductance or impedance to differential-mode currents. Common mode currents, such as ambient noise in the wire pair 10, however, see a high impedance due to the combined inductances of the windings. The CMC 20 ideally eliminates or greatly attenuates common mode RF noise while providing no loss for the differential data or DC voltage signals.

The capacitors C1 and C2 provide DC isolation for the PHY 12. Therefore, there is little attenuation of differential mode signals between the PHY 12 and the wires 16/18, while there is very high attenuation of common mode noise and DC power between the PHY 12 and the wires 16/18.

A PSE/PD 22 can be either a PSE or a PD, and the important point is that it is only coupled to the wires 16/18 by DC-coupling inductors L1 and L2. The inductors L1 and L2 provide a high impedance to the data signals, so the PSE/PD 22 impedance does not load the data signals.

If the circuit of FIG. 1 is on the PSE side, the operating voltage to the PHY 12 may be supplied by the PSE to the power input terminals VDD and VSS. A voltage regulator may be used. The capacitor C3 smooths the voltage at the PHY 12 power inputs. If the circuit of FIG. 1 is on the PD side, the operating voltage to the PHY 12 may be supplied by the PSE, via the wires 16/18, to the power input terminals VDD and VSS. A voltage regulator may be used.

FIG. 2 is similar to FIG. 1 except that the PSE/PD 22 and the inductors L1/L2 are on the line side of the CMC 20, so the DC power does not need to be conducted by the CMC 20.

In FIG. 3, an isolation transformer 24, having windings L3 and L4, is used, instead of a CMC, to attenuate common mode noise.

FIGS. 1-3 are simplified in that they do not show a controller IC that performs a low-power handshaking routine to determine whether the PD is compatible with receiving DC power via the wires 16/18 and then closes a power switch to couple the full DC voltage to the wires 16/18. The PD side includes another controller IC that communicates with the PSE controller IC to determine whether the full DC voltage should be supplied to the PD.

In these various embodiments, the inductors L1 and L2 are discrete components that are supplied by the user. Inductors are relatively large and expensive. It would be desirable to create a suitable PoDL circuit without using discrete inductors and to achieve the DC coupling/decoupling using integrated circuitry, such as within the same chip used for the PHY or the controller.

It is known to simulate the impedance characteristics of an inductor using active circuitry that can be integrated on a chip. Such circuits are sometimes referred to as a gyrator or an active inductor. However, many existing gyrator designs are not suitable for a PoDL circuit that transmits balanced differential data over the same wire pair used to conduct DC power. Also, the voltage drops of some gyrators are too high for simply replacing inductors with the gyrators.

What is needed is a PoDL circuit using a suitable gyrator design, where the inductor function can be implemented within an integrated circuit, such as on the same chip used to perform other PoDL functions. In such a case, there is no additional expense is providing the DC-coupling/decoupling function.

SUMMARY

Various PoDL circuits are described along with various gyrator designs that obviate the use of discrete inductors for DC-coupling/decoupling. The gyrators use a small integrated capacitor and invert and multiply the capacitor impedance to emulate an inductor. The gyrators present a high impedance to AC signals and a low impedance to DC voltage. The gyrators may be formed on an IC chip.

In one embodiment of the PD side of a PoDL circuit, only one gyrator is used to replace one inductor and conduct a positive DC supply voltage, and the reference DC voltage is directly tapped off one of the wires (rather than decoupled using an inductor). Since only one gyrator is used, there is a minimum of voltage drop.

In one embodiment of the PSE side of a PoDL circuit, where the PSE reference voltage is not grounded, only one gyrator is used to replace one inductor, and the PSE positive voltage is directly coupled to one of the wires. Other configurations are disclosed, along with positive and negative polarity gyrators. Since gyrators have a DC voltage drop, such as 2 volts, it is best to have a minimum number of gyrators.

The gyrators may be coupled to the line side of the CMC or to the PHY side of the CMC. For PSE and PD embodiments that use one gyrator, the gyrator may be coupled to the PHY side of a CMC to minimize the amount of common mode signal on the wire pair.

In another embodiment, each of the two inductors is replaced with a separate gyrator. The gyrators may be interconnected, such as to share a common capacitor.

Various gyrators designs are described for optimizing DC-coupling/decoupling and reducing voltage drop. A different gyrator may be used for the PSE side and PD side.

Gyrators are described with analog current limit and power switch control, so multiple functions are integrated on the same IC chip.

Other benefits and embodiments are described

BRIEF DESCRIPTION OF THE DRAWINGS

FIG. 25 illustrates a PD application where a single positive polarity NPN BJT Darlington pair gyrator is used to switch the power and limit the inrush current into the PD after turn-on.

Elements that are the same or equivalent in the various figures are labelled with the same numerals.

DETAILED DESCRIPTION OF THE EMBODIMENTS

Embodiments are described that replace PoDL inductors with an active circuit (a gyrator) that presents a low impedance to DC power but a high impedance to AC data signals. This impedance requirement may be the result of a differential mode return loss requirement as measured at the medium dependent interface (MDI) of the PHY.

Figure 1:
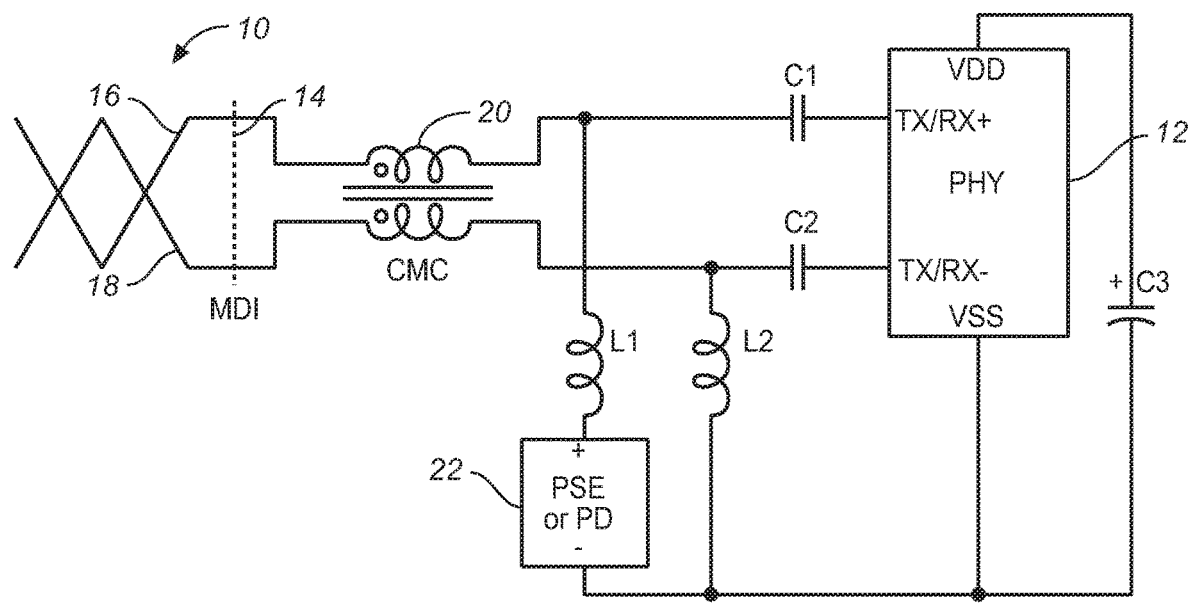
FIG. 1 illustrates one example of a conventional PoDL system.
Figure 2:
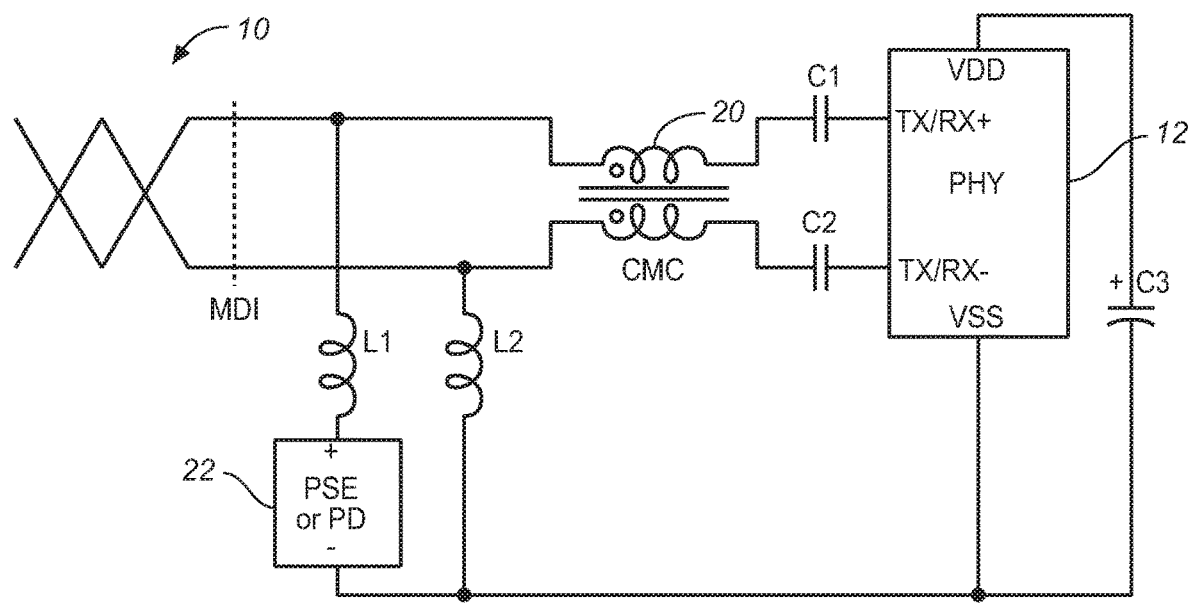
FIG. 2 is identical to FIG. 1 except that the PSE/PD and the inductors are on the line side of the CMC.
Figure 3:
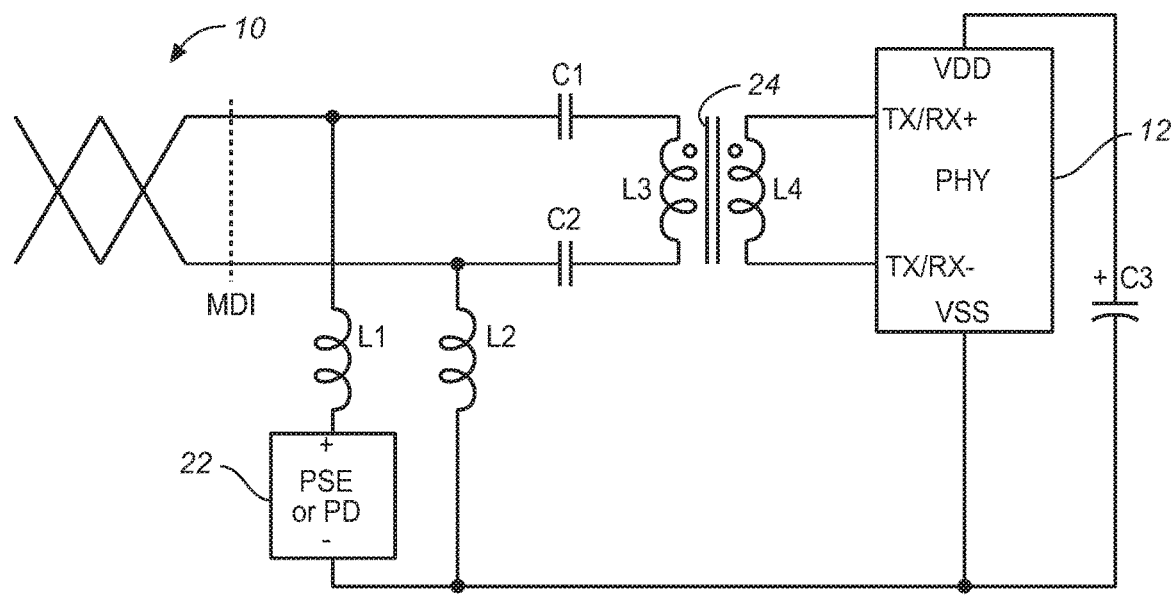
FIG. 3 illustrates the use of an isolation transformer 24, instead of a CMC, to attenuate common mode noise.
Figure 4:
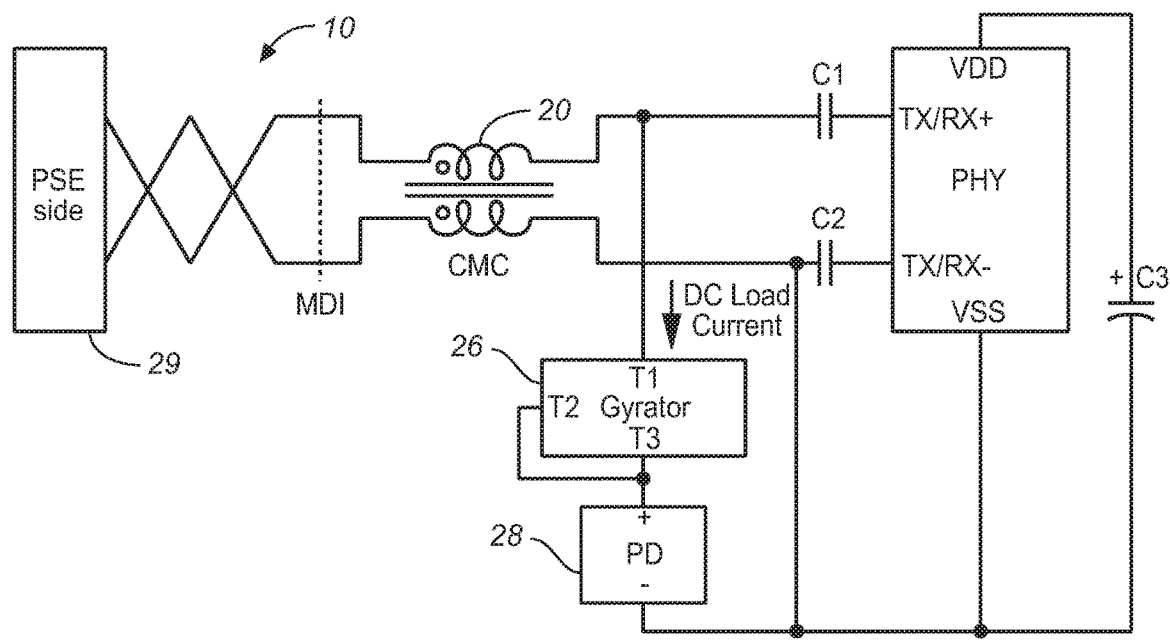
FIG. 4 illustrates the PD side of a PoDL system, similar to FIG. 2 except a positive polarity gyrator with three terminals is connected between one of the PHY's DC blocking capacitors and the positive terminal of a PD.

FIG. 4 illustrates the PD side of a PoDL system, where a positive polarity gyrator 26 with three terminals is connected between the AC-coupling capacitor C1 and the positive terminal of a PD 28. The PD 28 can be any powered load, such as a camera, a phone, thermostat, etc. The gyrator 26 is positive polarity because the DC load current flows into the terminal T1. A common mode choke (CMC) 20 may be used to connect the conductors of the wire pair 10 to the gyrator 26 and the PHY's AC-coupling capacitors C1 and C2. The CMC 20 attenuates common mode signals and noise but passes DC and differential data. The gyrator 26 will be discussed later with respect to FIGS. 6 and 7. The gyrator 26 uses a negative feedback path between its terminals T2 and T3.

Figure 5:
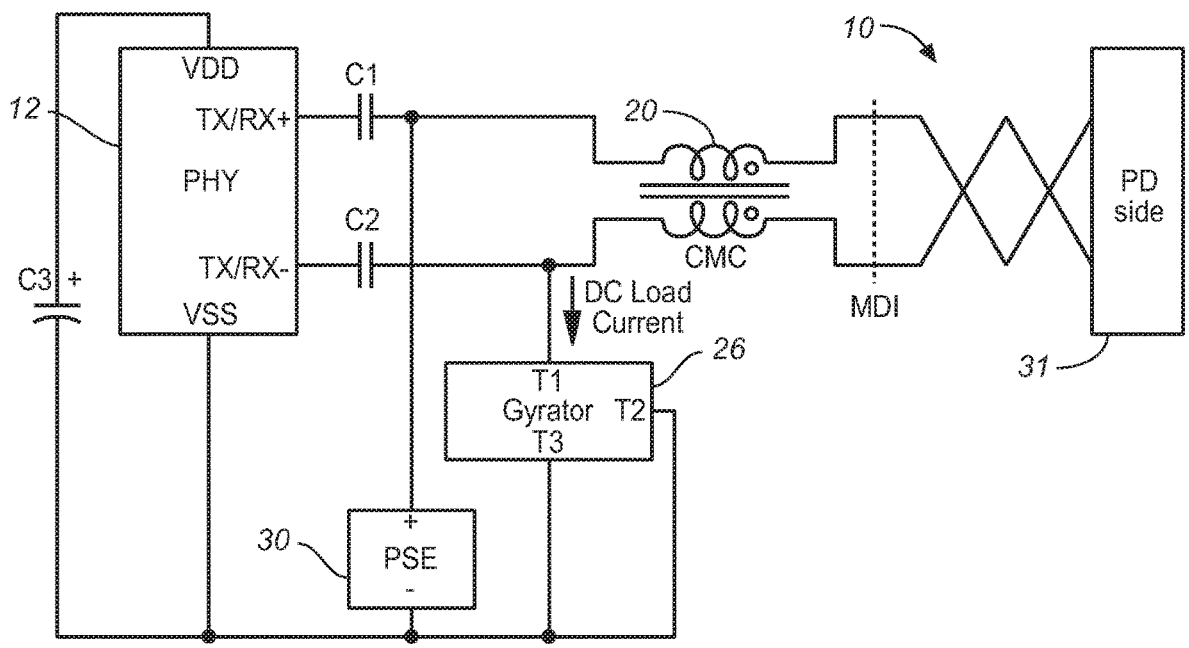
FIG. 5 shows the PSE side being connected to the PD side via the wire pair. A positive polarity gyrator is connected between one of the PHY's DC blocking capacitors and the PSE return.

FIG. 5 illustrates the positive polarity gyrator 26 in a PSE application, where the PSE 30 includes a DC power supply, such as a battery, a voltage regulator, etc. The positive voltage output of the PSE 30 is directly connected to the AC-coupling capacitor C1, and the return path is coupled to the AC-coupling capacitor C2 via the gyrator 26. The gyrator 26 effectively passes DC power but greatly impedes the flow of AC current. Therefore, the data signals may not be affected by the PSE 30.

FIG. 4 shows the PD side being connected to the PSE side 29 via the wire pair 10. The PSE side 29 may be the circuit of FIG. 5.

Similarly, FIG. 5 shows the PSE side being connected to the PD side 31 via the wire pair 10. The PD side 31 may be the circuit of FIG. 4. This same type of configuration may be applied to all the figures.

Figure 6:
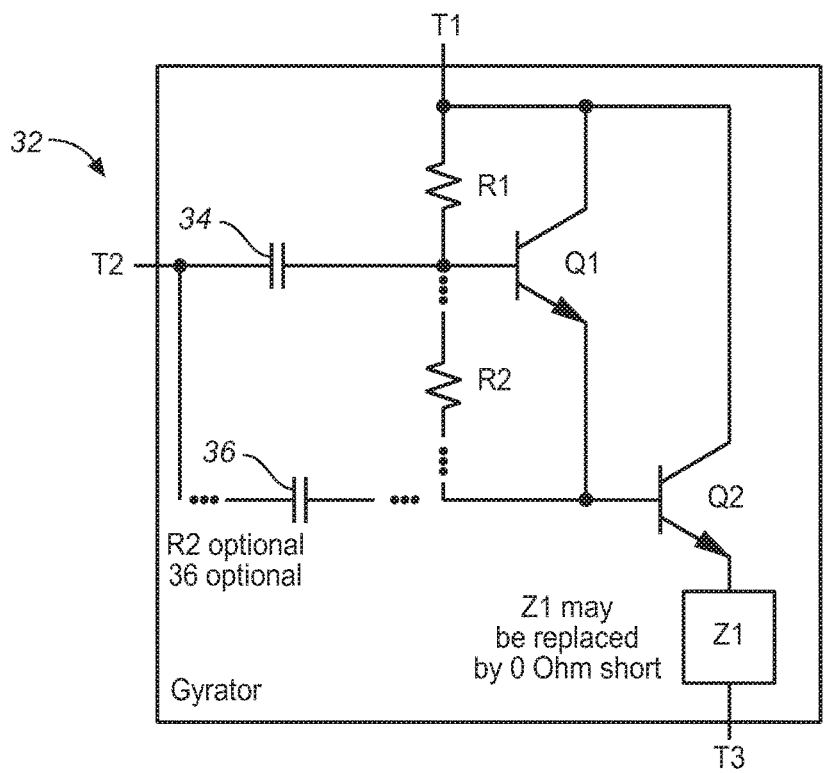
FIG. 6 illustrates one embodiment of the 3-terminal positive polarity gyrator that may be the gyrator in FIGS. 4 and 5.

FIG. 6 illustrates one embodiment of the 3-terminal positive polarity gyrator 32 that may be the gyrator 26 in FIGS. 4 and 5.

The gyrator 32 uses NPN bipolar junction transistors (BJTs) Q1 and Q2 configured as a Darlington Pair for a high current gain. The collectors of transistors Q1 and Q2 are connected to terminal T1. The base of Q1 is connected to terminal T1 by resistor R1 and terminal T2 by capacitor 34. The emitter of transistor Q2 is may be connected to terminal T3 by an optional impedance Z1, where the voltage dropped across impedance Z1 may provide negative feedback to the base-emitter voltage of transistor Q2 in response to changes in the emitter current of transistor Q2. This negative feedback serves to impede the low of AC current from terminal T1 to terminal T3. Impedance Z1 may comprise a resistor, inductor, or series combination of a resistor and an inductor. Impedance Z1 may be replaced with a 0 Ohm short. When terminal T2 is shorted to terminal T3, as shown in FIGS. 4 and 5, the impedance between terminals T1 and T2/T3 is substantially increased for frequencies where the capacitor 34's AC impedance is much less than the value of resistor R1. The second capacitor 36 may be required to provide a low AC impedance between transistor Q2's base and terminal T2. Optional resistor R2 may be used to keep transistor Q1's collector-base junction sufficiently reverse biased when AC voltage is present between terminals T1 and T2/T3.

The effect of the gyrator 32 is to multiply and invert the impedance of the capacitor 34. When a DC voltage is coupled across the gyrator 32, the capacitor 34, during steady state, does not draw any current from the terminal T1, causing the base of transistor Q1 to track the voltage at terminal T1. For AC signals with frequency greater than $1/(2\pi*R1*C)$ where C is the capacitance of capacitor 34, the AC voltage between terminals T2 and T3 is very small and the subsequent change in the base current of Q1 is minimized. Thus, the impedance of the capacitor 34 is inverted and amplified between terminals T1 and T3. This attenuation of current vs. frequency function emulates the characteristic of an inductor. The values of the resistors and capacitor 34 can be chosen so that the effective inductance is very high.

Note that a multiple of the transistor Q1's base-emitter voltage (VBE) voltage appears across the resistor R1. This may be a disadvantage if the total resulting voltage drop between terminals T1 and T3 adversely affects the performance of the PoDL system. By using a CMC with sufficient common mode insertion loss where the gyrator is connected to one of the PHY side terminals of the CMC, only one gyrator may be needed.

Figure 7:
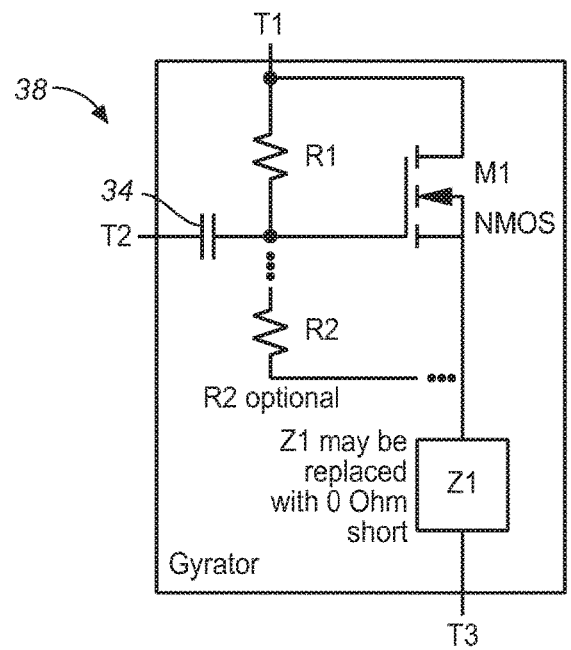
FIG. 7 illustrates another embodiment of a positive polarity gyrator where the BJT Darlington Pair is replaced by an N-channel MOSFET. Its performance is the same as that of FIG. 6.

FIG. 7 illustrates another embodiment of a positive polarity gyrator 38 where the BJT Darlington Pair is replaced by an N-channel MOSFET M1. Its performance is the same as that of FIG. 6.

As shown in FIG. 4, if a single gyrator 26 is connected to one of the conductors that are coupled by the AC-coupling capacitor C1 to the PHY's TX/RX pin, the remaining TX/RX pin may be AC coupled by the AC-coupling capacitor C2 to the PHY's VSS terminal. Consequently, the AC impedance into the TX/RX pin that is AC-coupled to the gyrator 26 with respect to the PHY's VSS terminal may have to be approximately equal to 100 Ohms to satisfy the differential mode return loss requirement of the PHY 12 as seen at the MDI. 100 Ohms is the typical characteristic impedance of a twisted wire pair, so a termination impedance of 100 Ohms is desirable to mitigate reflections.

Figure 8:
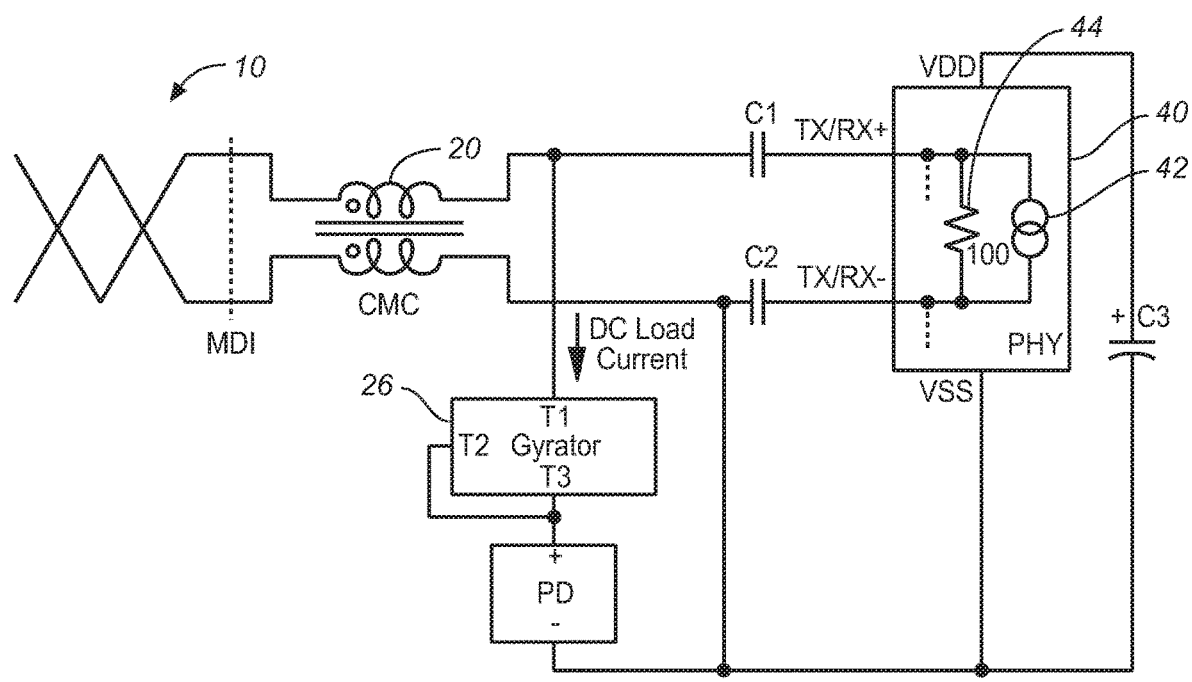
FIG. 8 illustrates an example of a current mode PHY with a differential termination scheme that may meet the differential mode MDI return loss requirement when a single gyrator is connected to the PHY side of the CMC.

FIG. 8 illustrates an example of a current mode PHY 40 with a termination scheme that meets this 100 Ohm requirement. FIG. 8 is identical to FIG. 4 but shows an example of the transmit output portion of the PHY 40. In the current mode PHY 40, the current source 42 output is varied to create a varying voltage drop across the resistor 44, which forms the differential data transmitted on the twisted wire pair 10. The resistor 44 is 100 Ohms to satisfy the differential mode return loss requirement of the PHY. Other resistances may be suitable to satisfy a particular differential mode return loss requirement.

Figure 9:
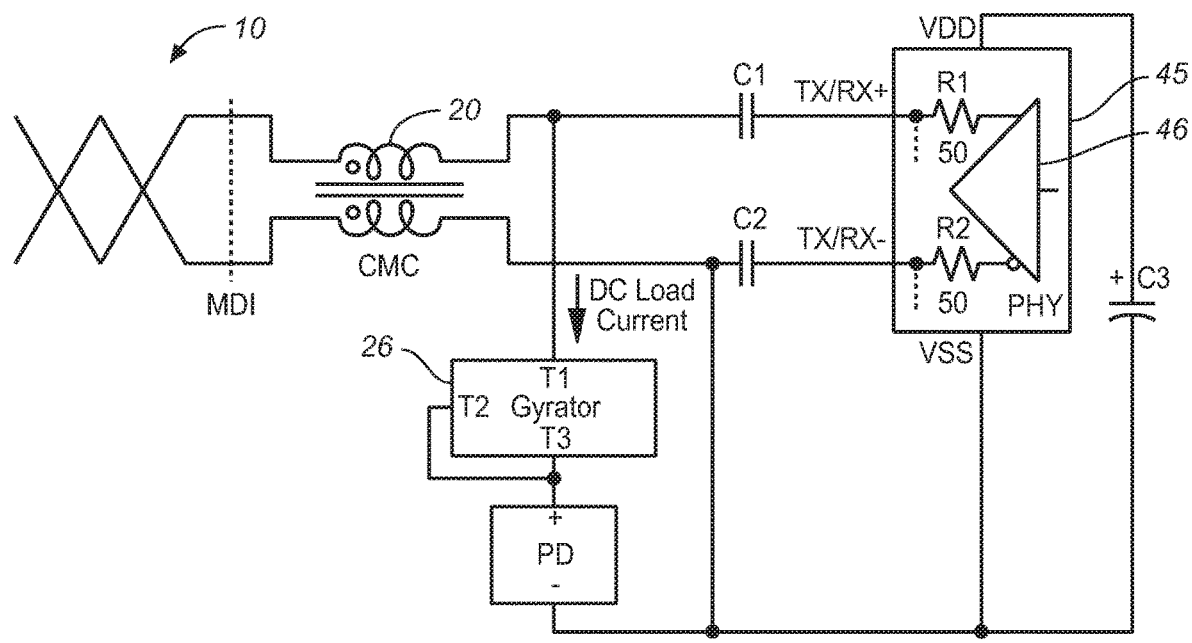
FIG. 9 illustrates an example of a voltage mode PHY with a termination scheme that may not be able to meet the differential mode MDI return loss requirement when only one gyrator is present.

FIG. 9 illustrates an example of a voltage mode PHY 45 with a termination scheme that may not meet the return loss requirement when only one gyrator is present. Only the transmit output portion of the PHY 45 is shown. A varying input voltage into an amplifier 46 applies inverted and non-inverted differential signals to the wire pair 10. Since the AC impedance of capacitor C2 is small at the frequencies where the PHY transmits, the 50 Ohm resistor R2 in series with the inverted output of transmitter may be effectively shorted to VSS. Consequently the differential mode impedance may only be the 50 Ohms of resistor R1.

Since there may be substantial common mode voltage at the TX/RX pins when only one gyrator is used, a CMC 20 may be required to prevent the common mode signal from appearing on the conductors of the wire pair 10. The CMC 20 may also be required to prevent common mode signals present on the conductors of the wire pair 10 from being converted into differential signals at the PHY's TX/RX pins. If the PoDL current flowing in each of the conductors of the wire pair 10 is equal and opposite in polarity, the CMC windings may be well matched to cancel core flux.

Figure 10:
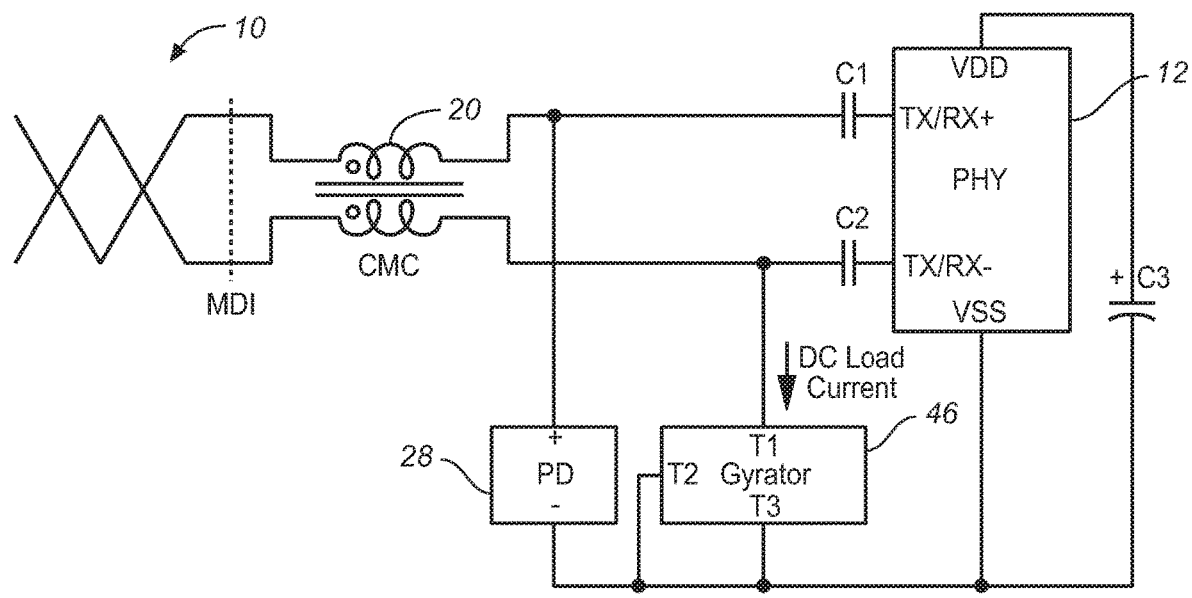
FIG. 10 illustrates another application of the invention where a single negative polarity gyrator is connected to the negative voltage terminal of a PD.

FIG. 10 illustrates another application of the invention where a negative polarity gyrator 46 is connected to the negative voltage terminal of a PD 28. The negative polarity gyrator 46 has DC load current flowing out of terminal T1.

Figure 11:
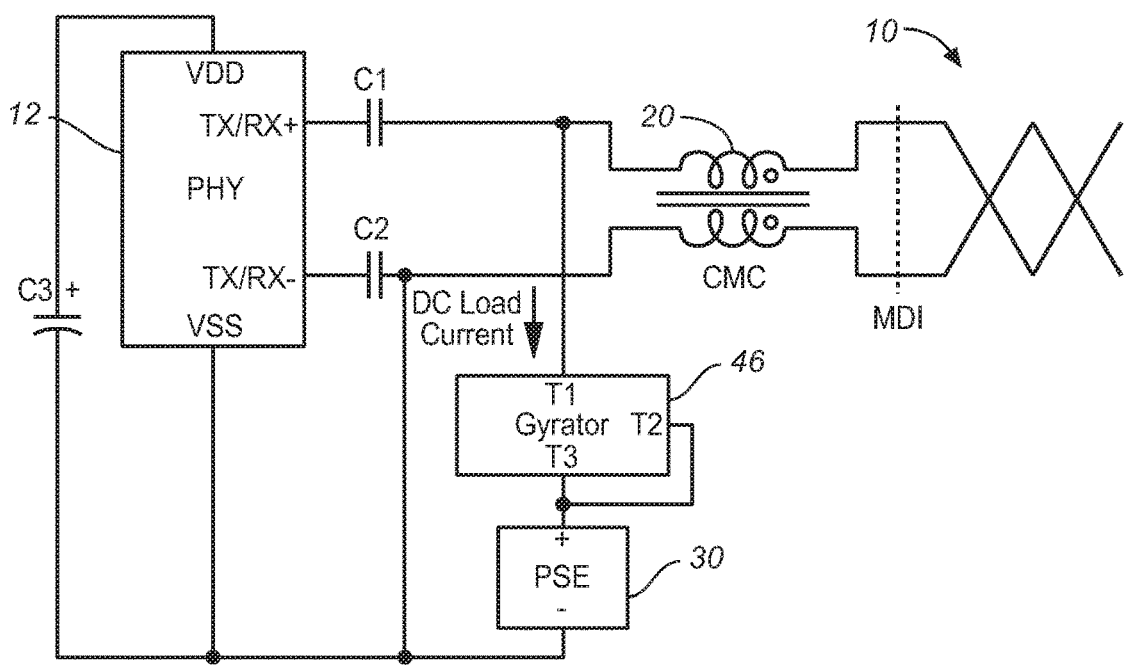
FIG. 11 illustrates a single negative polarity gyrator in a PSE application between the positive voltage output of the PSE and the conductor connected to capacitor C1.

FIG. 11 illustrates the negative polarity gyrator 46 in a PSE application between the positive voltage output of the PSE 30 and the conductor connected to capacitor C1.

Figure 12:
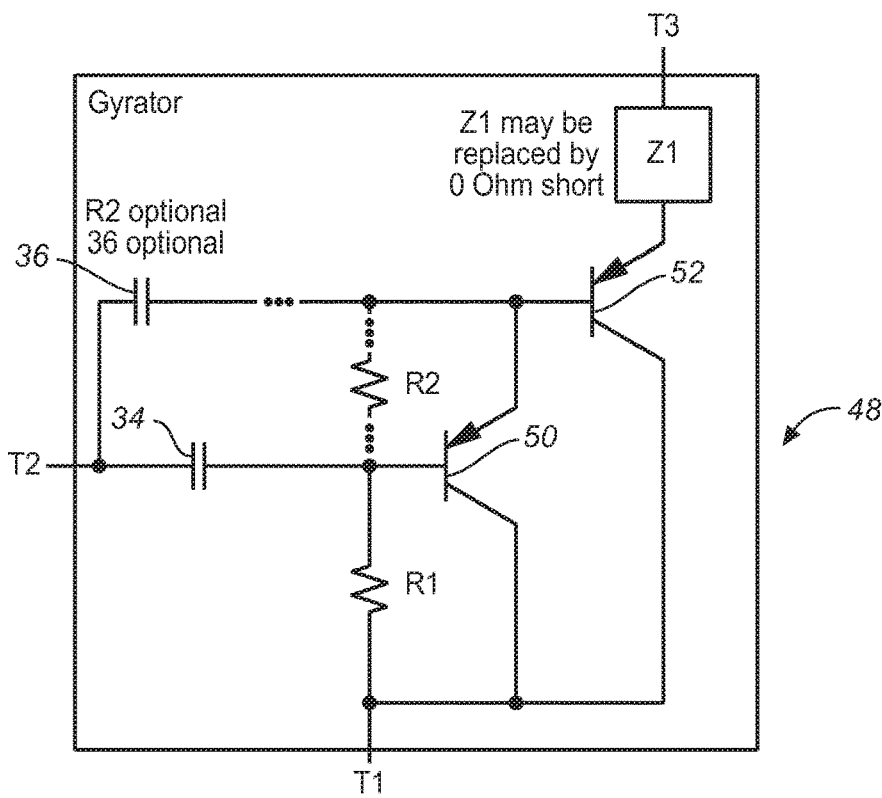
FIG. 12 illustrates an embodiment of a negative polarity gyrator that may be used as the gyrator in FIGS. 10 and 11.

FIG. 12 illustrates an embodiment of a negative polarity gyrator 48 that may be used as the gyrator 46 in FIGS. 10 and 11. The gyrator 48 is based on a PNP BJT Darlington pair, consisting of PNP transistors 50 and 52. It operation is the same as the positive polarity gyrator 46 except the polarities are reversed.

Figure 13:
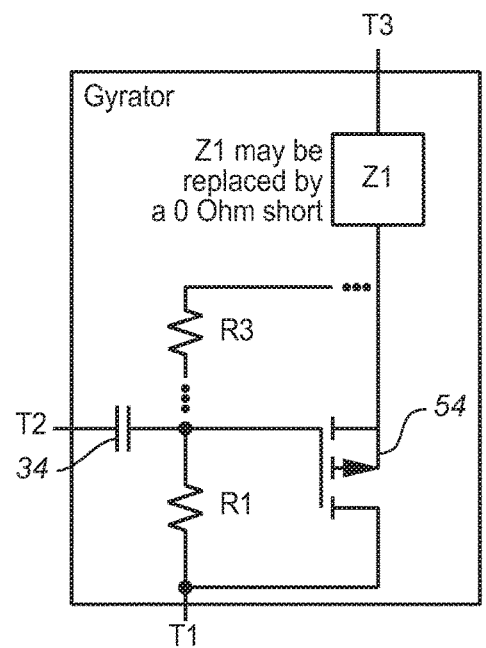
FIG. 13 illustrates replacing the PNP Darlington pair with a P-channel MOSFET.

As shown in FIG. 13, it is also possible to replace the PNP Darlington pair with a P-channel MOSFET 54. The operation is the same as in FIG. 12.

For applications where the CMC is unable to provide enough common mode insertion loss or where the CMC cannot conduct the PoDL current, it may be necessary to use two gyrators. The disadvantage of this approach is the additional power dissipation and voltage drop required by the second gyrator.

Figure 14:
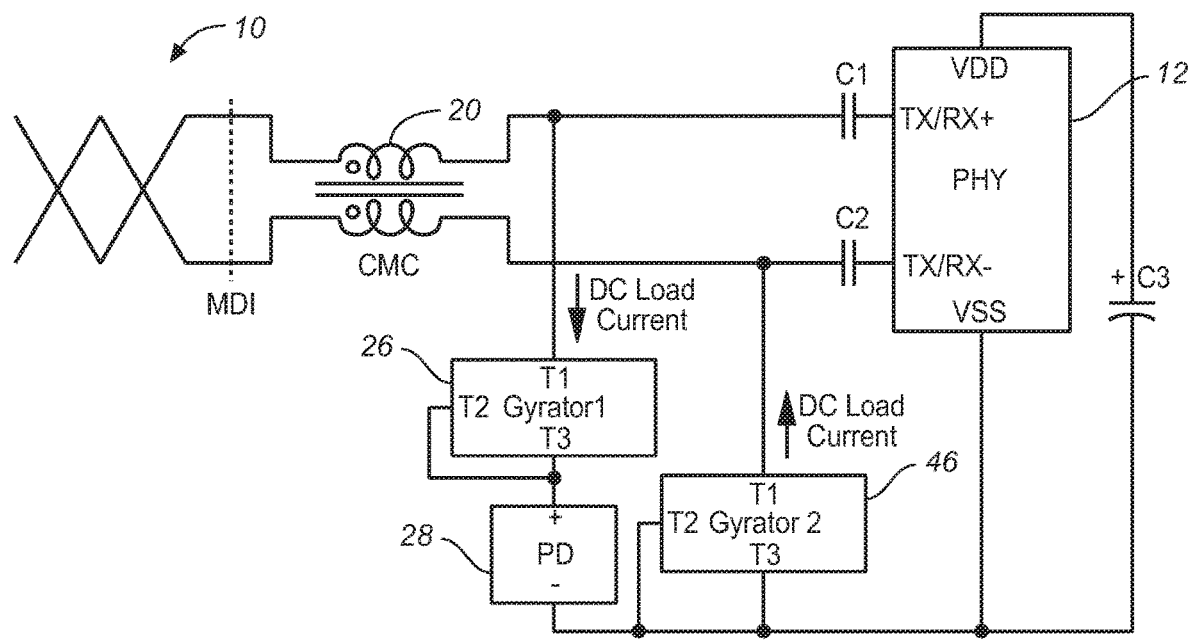
FIG. 14 illustrates the use of both a positive polarity gyrator and negative polarity gyrator in a PHY-side PD application.

FIG. 14 illustrates the use of both a positive polarity gyrator 26 and a negative polarity gyrator 46 in a PHY-side PD application. In this configuration, a voltage mode PHY 12 may be used since both of the PHY's TX/RX pins see high AC impedance with respect to the VDD/VSS pins. There is improved AC isolation of the PD 28 using two gyrators. The two gyrators may be formed in the same integrated circuit and may even be formed on the same integrated circuit chip as the PHY or a PoDL controller (which conducts a handshaking routine with the PSE).

Figure 15:
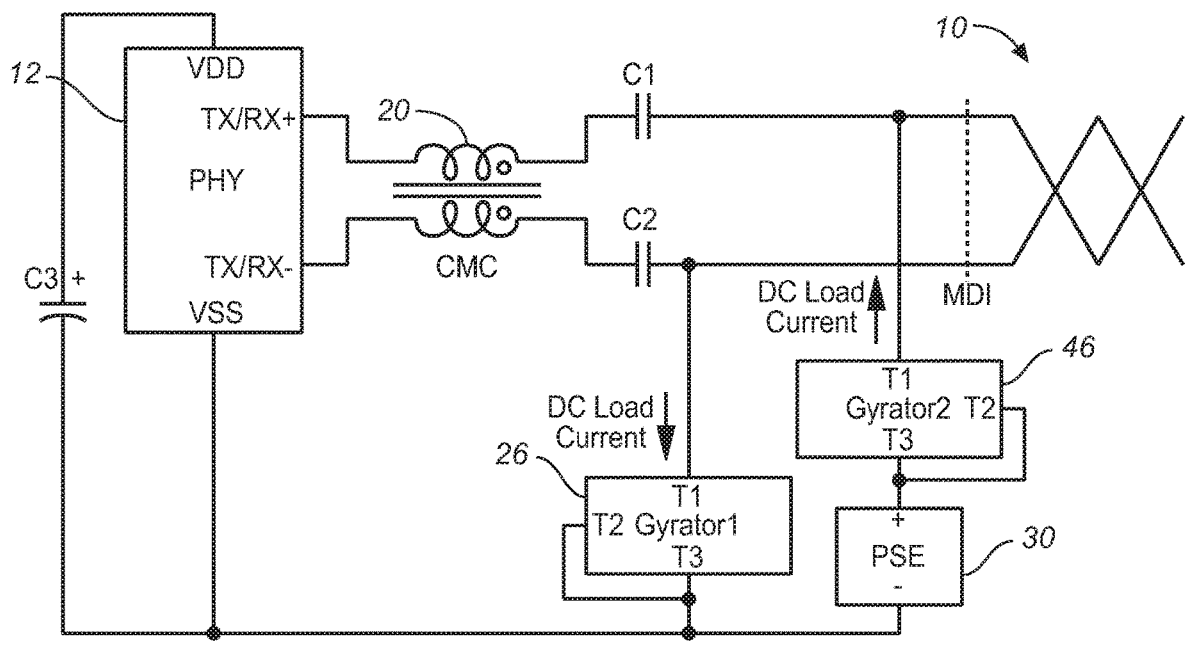
FIG. 15 shows the use of both a positive polarity gyrator and a negative polarity gyrator in a line-side PSE application, so DC power does not have to pass through the CMC.

FIG. 15 shows the use of both a positive polarity gyrator 26 and a negative polarity gyrator 46 in a line-side PSE application, so DC power does not have to pass through the CMC 20, thus removing the requirement that the CMC 20 conduct the PoDL current and withstand the PoDL voltage. The two gyrators may be formed in the same integrated circuit and may even be formed on the same integrated circuit chip as the PHY or a PoDL controller (which conducts a handshaking routine with the PD).

Figure 16:
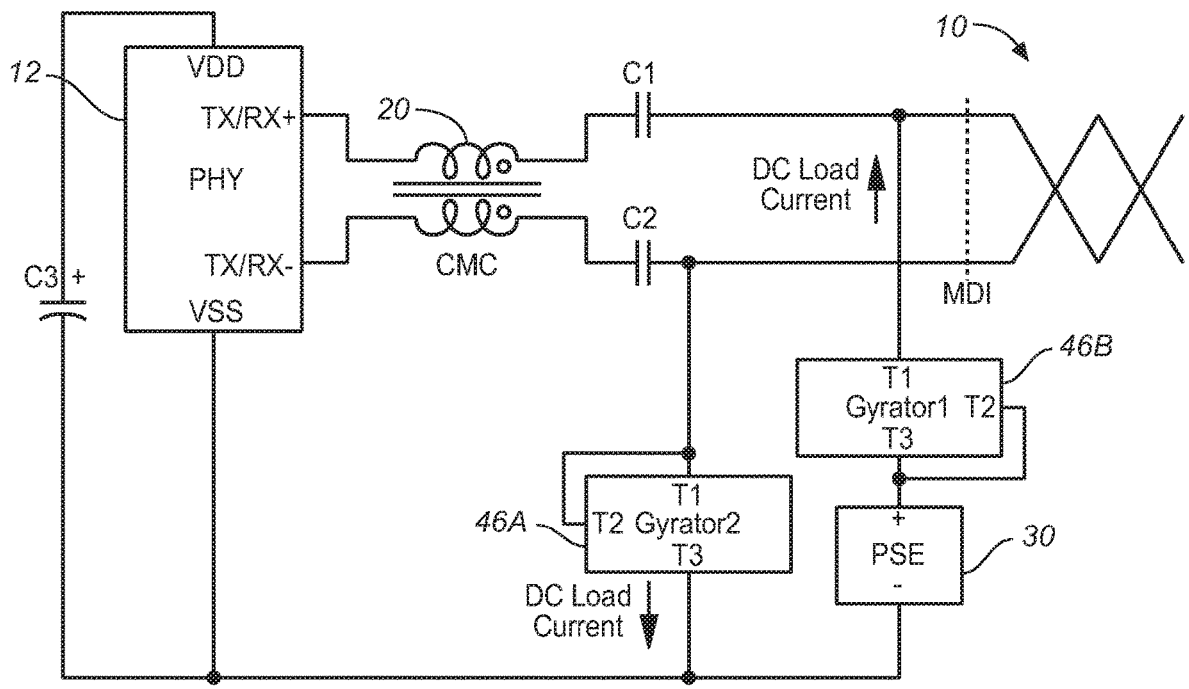
FIG. 16 shows a line-side PSE application where two negative polarity gyrators are used.

FIG. 16 shows a line-side PSE application where two negative polarity gyrators 46A and 46B are used.

Figure 17:
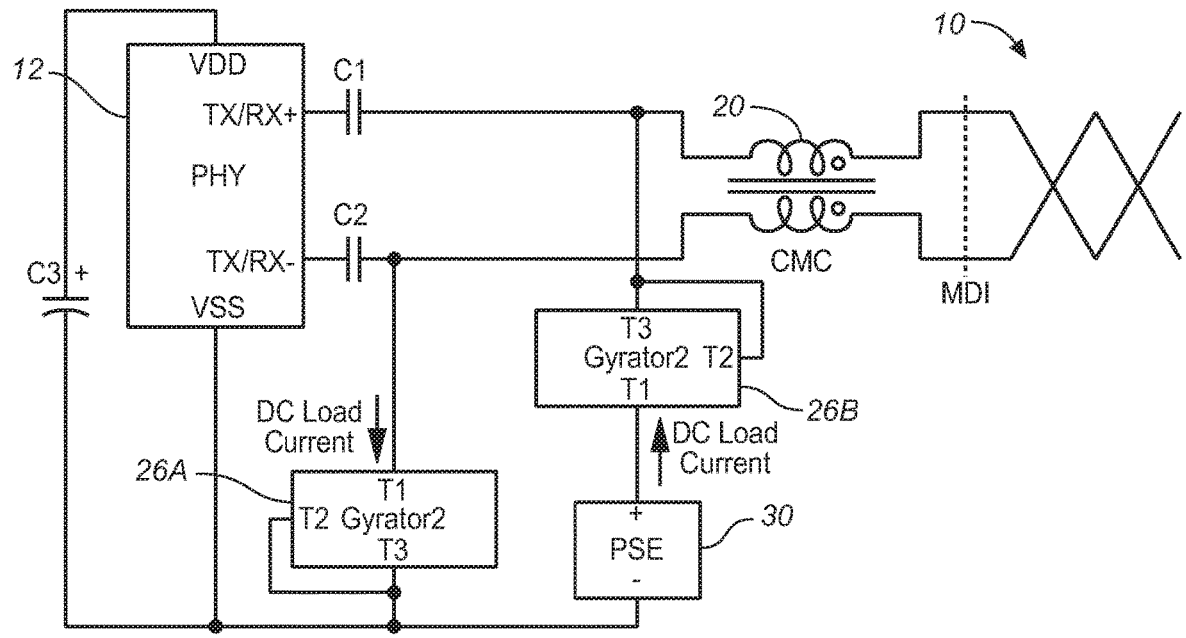
FIG. 17 shows a PHY-side PSE application where two positive polarity gyrators are used.

FIG. 17 shows a PHY-side PSE application where two positive polarity gyrators 26A and 26B are used.

Figure 18:
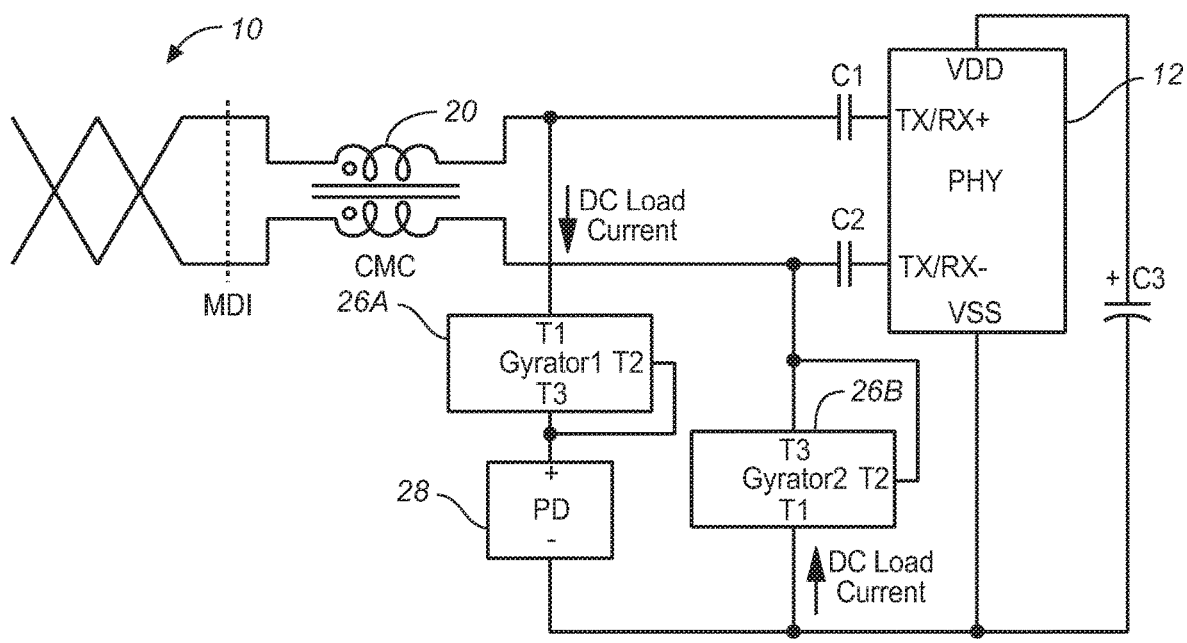
FIG. 18 shows a PHY-side PSE application where two positive polarity gyrators are used.

FIG. 18 shows a PHY-side PD application where two positive polarity gyrators 26A and 26B are used.

Figure 19:
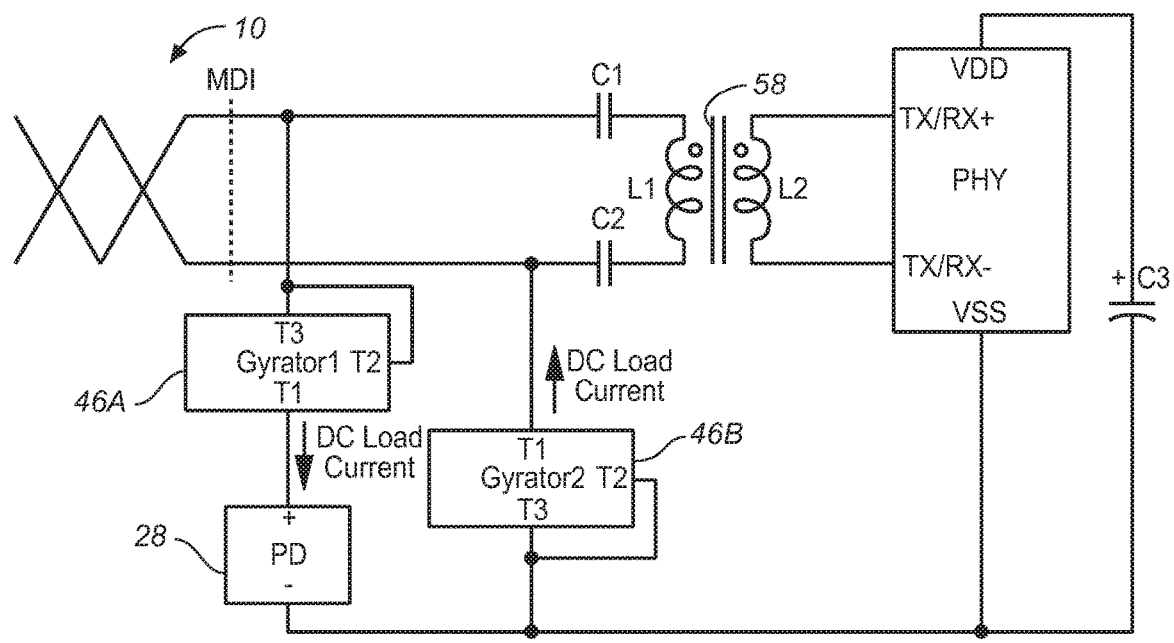
FIG. 19 shows a line-side PoDL PD application with two negative polarity gyrators and a transformer being substituted in place of the CMC.

FIG. 19 shows a line-side PoDL PD application with two negative polarity gyrators 46A and 46B and a transformer 58 being substituted in place of the CMC. The transformer 58 blocks DC power and common mode signals.

Figure 20:
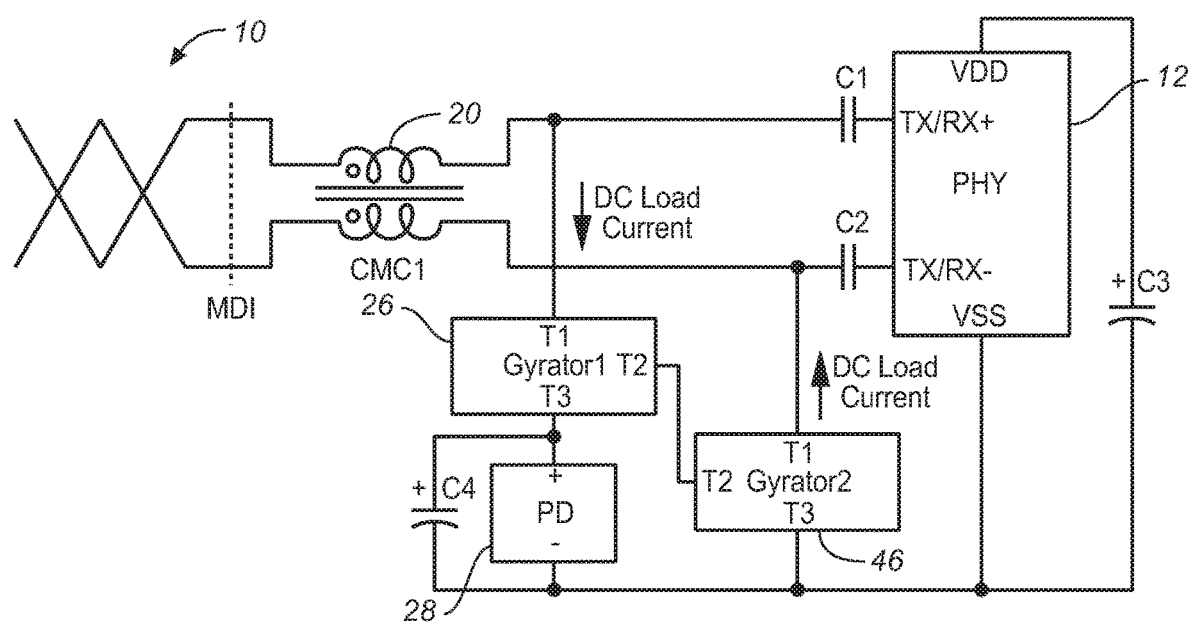
FIG. 20 shows a PHY-side PoDL PD application with both a positive polarity gyrator and a negative polarity gyrator where the T2 terminals are shorted together.

FIG. 20 shows a PHY-side PoDL PD application with both a positive polarity gyrator 26 and negative polarity gyrator 46 where the T2 terminals are shorted together. The capacitors in the two gyrators may be merged together into one capacitor with this approach.

It may be also possible to cascade an inductor with an active gyrator to augment the differential mode return loss.

Figure 21:
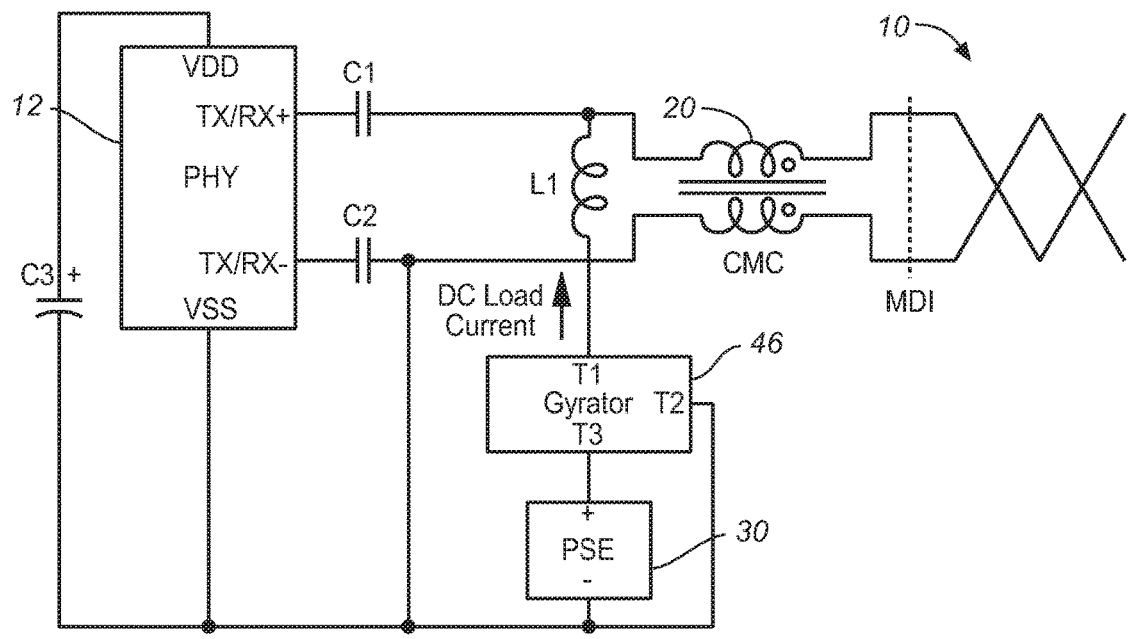
FIG. 21 illustrates a PHY-side PoDL PSE application where a single negative polarity gyrator has been placed in series with a small inductor that may be integrated on the same chip as the gyrator.

FIG. 21 illustrates a PHY-side PoDL PSE application where a single negative polarity gyrator 46 has been placed in series with an inductor L1. This improves the AC attenuation and allows the inductor L1 value to be different from the effective inductor value of the gyrator 46. Therefore, the inductor L1 can be very small to attenuate very high frequency signals without a significant voltage drop, and the gyrator 46 can be designed to attenuate lower frequency signals with a larger voltage drop. Since the inductor L1 may be small, it can be integrated with the gyrator 46 as a planar spiral inductor.

All gyrators described herein may be formed as an IC and may be a stand-alone chip or added to any other IC in the PoDL system at low cost.

Figure 22:
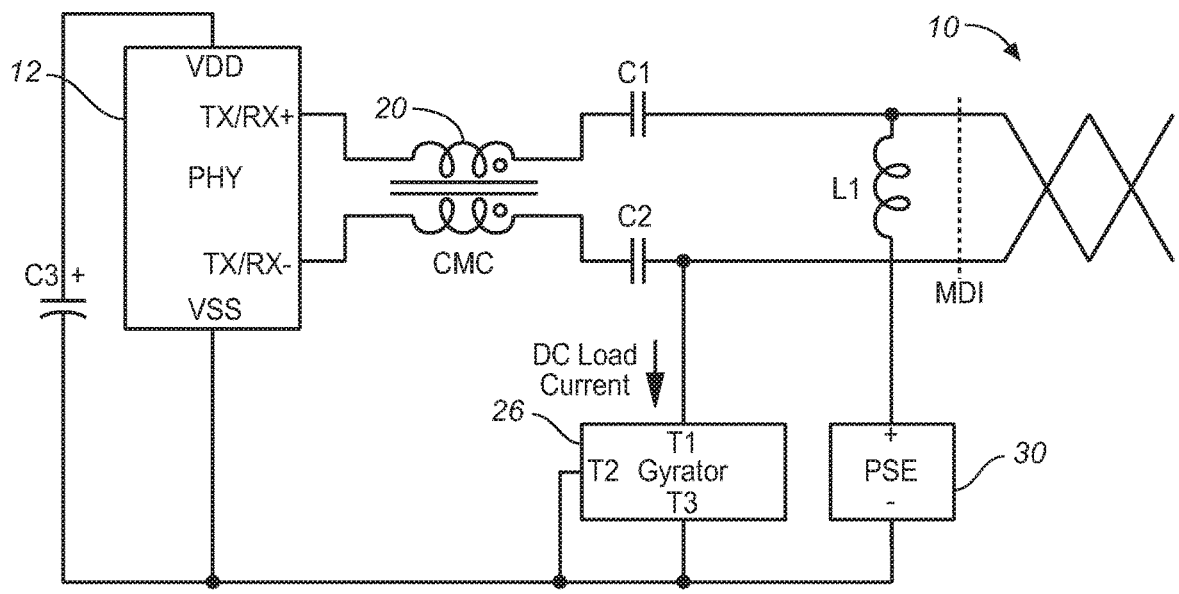
FIG. 22 illustrates another PHY-side PoDL PSE application with a single positive polarity gyrator where an inductor has been used to couple the positive terminal of the PSE to one of the conductors carrying the PHY's data.

FIG. 22 illustrates a Line-side PoDL PSE application with a single positive polarity gyrator 26 where inductor L1 has been used to couple the positive terminal of the PSE 30 to one of the conductors carrying the PHY's data. In addition to augmenting the differential mode return loss, this approach may allow a voltage mode PHY to operate in applications where a single active gyrator is used.

The gyrator circuit topologies described so far may be augumented to switch the DC voltage, control inrush current during start-up, and sense the DC current. Therefore, multiple functions can be added to the gyrator IC with little cost.

Figure 23:
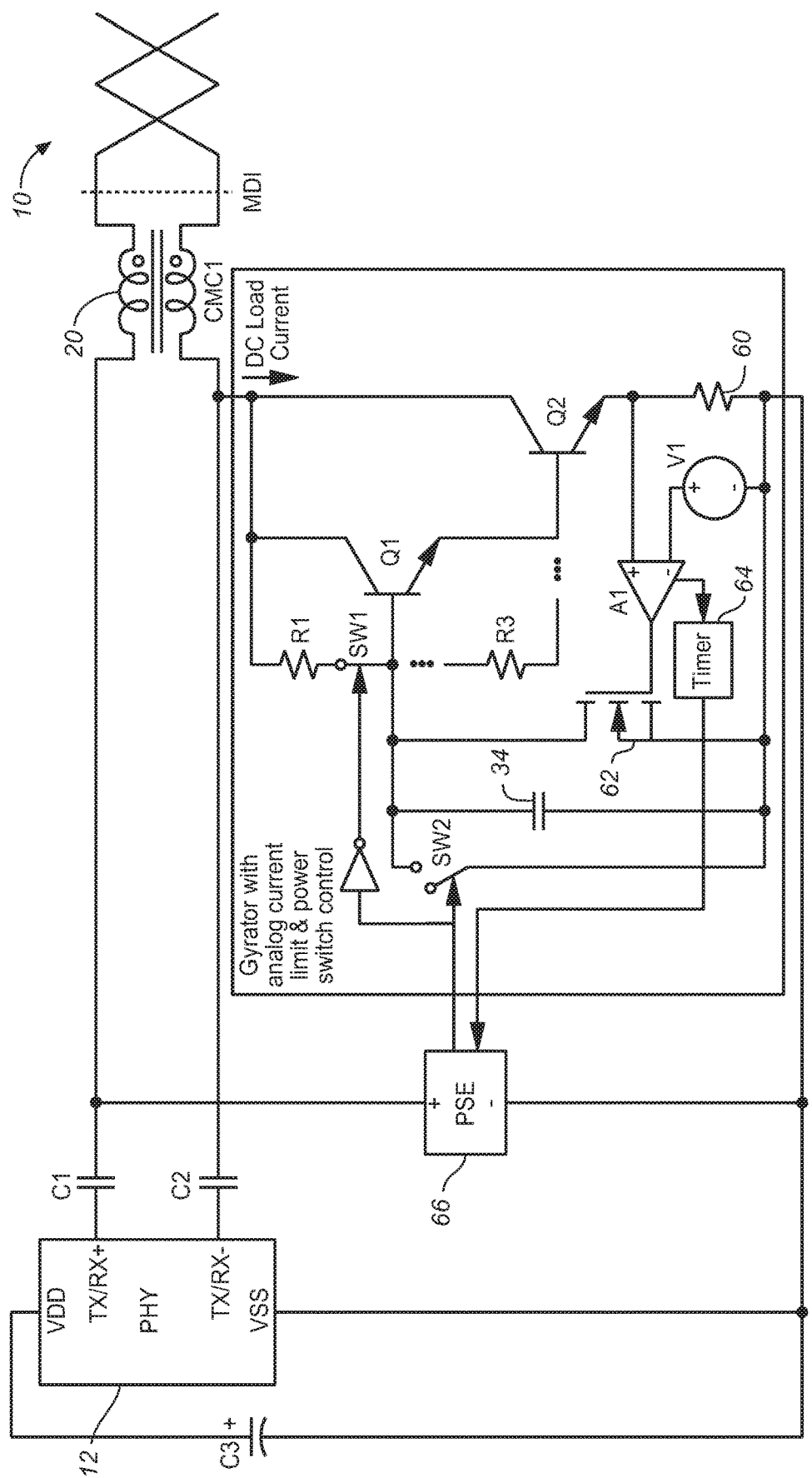
FIG. 23 illustrates an embodiment of a single positive polarity NPN BJT Darlington pair gyrator that implements analog current limit and switches the PSE's voltage and current that is returned to the negative conductor of the wire pair.

FIG. 23 illustrates an embodiment of a single positive polarity NPN BJT Darlington pair gyrator that limits analog current and switches the PSE's voltage and current that is returned to the negative conductor of the wire pair 10. To limit the current, a voltage source V1 provides a reference voltage to a differential amplifier A1. The current through the resistor 60 creates a voltage drop that is compared to the reference voltage. If the voltage drop exceeds the reference voltage, the MOSFET 62 is enhanced, or made more conductive, to pull down the base of transistor Q1 to turn off the gyrator or otherwise limit the current. If the overcurrent continues past a threshold time, determined by a timer 64, the PSE 66 is configured to turn off its power. So, the current limiter allows a short-term, but relatively high, in-rush current upon start-up without turning off the PSE 66, and turns off the PSE 66 in the event of a fault.

Further, the PSE 66 may periodically perform a handshaking routine with the PD to ensure that the PD is compatible with receiving power via the wire pair 10. If the handshaking routine is successful, the PSE 66 controls the switch SW1 to close, to allow the incoming current to control the transistor Q1, and controls the switch 2 to open so that capacitor 34 is no longer shorted. The opposite happens when the PSE 66 determines that no power should be supplied to the PD. If a fault condition is determined by the current limiter, the timer 64 may turn off the PSE 66 or cause the switch SW1 to open and the switch SW2 to close.

Figure 24:
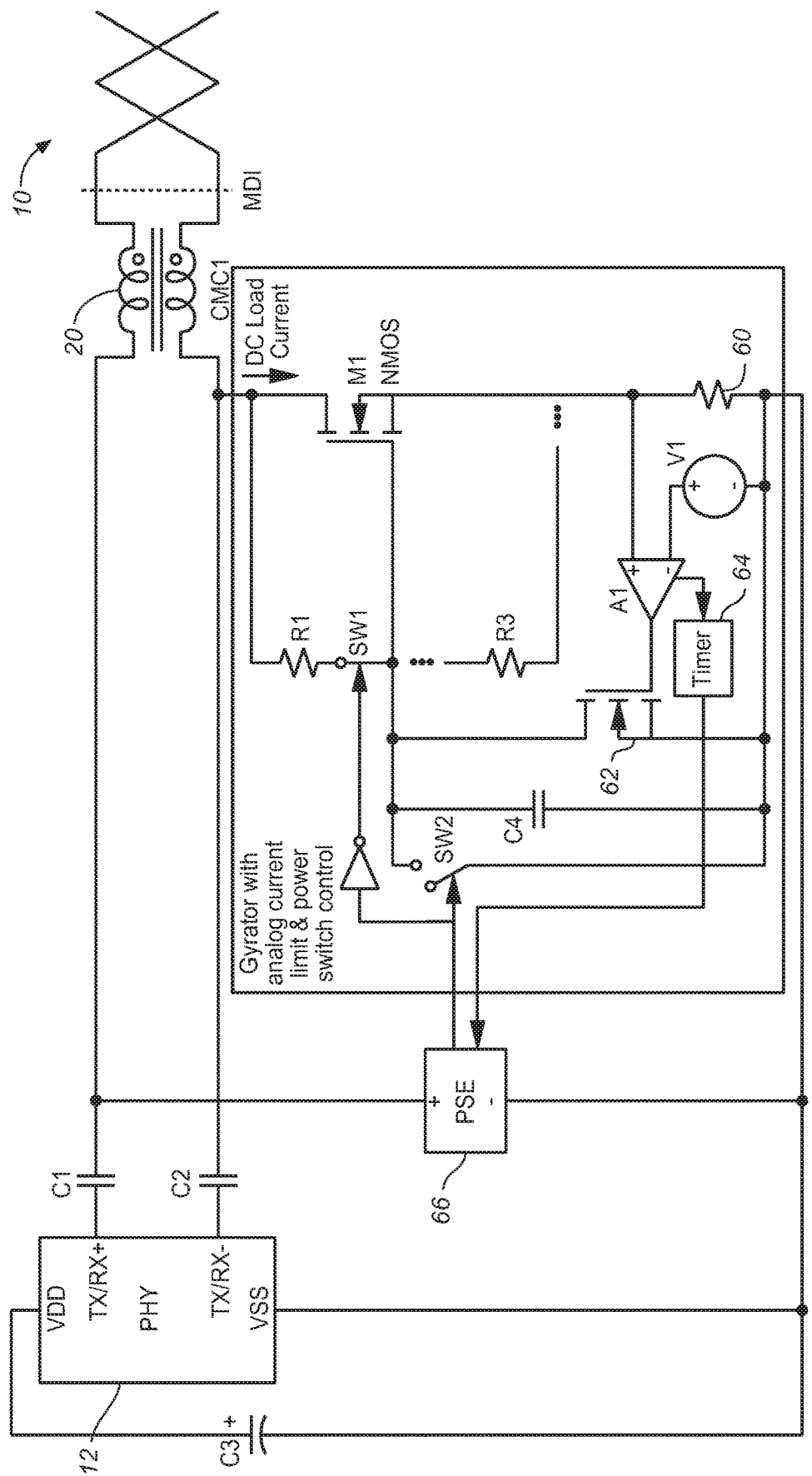
FIG. 24 illustrates an alternative embodiment that uses a N-channel MOSFET instead of the Darlington Pair of FIG. 23.

FIG. 24 illustrates an alternative embodiment that uses an N-channel MOSFET M1 instead of the Darlington Pair of FIG. 23.

The same functions may also be performed by a second gyrator in series with the PSE's positive terminal, similar to the configuration in FIG. 17.

Figure 25:
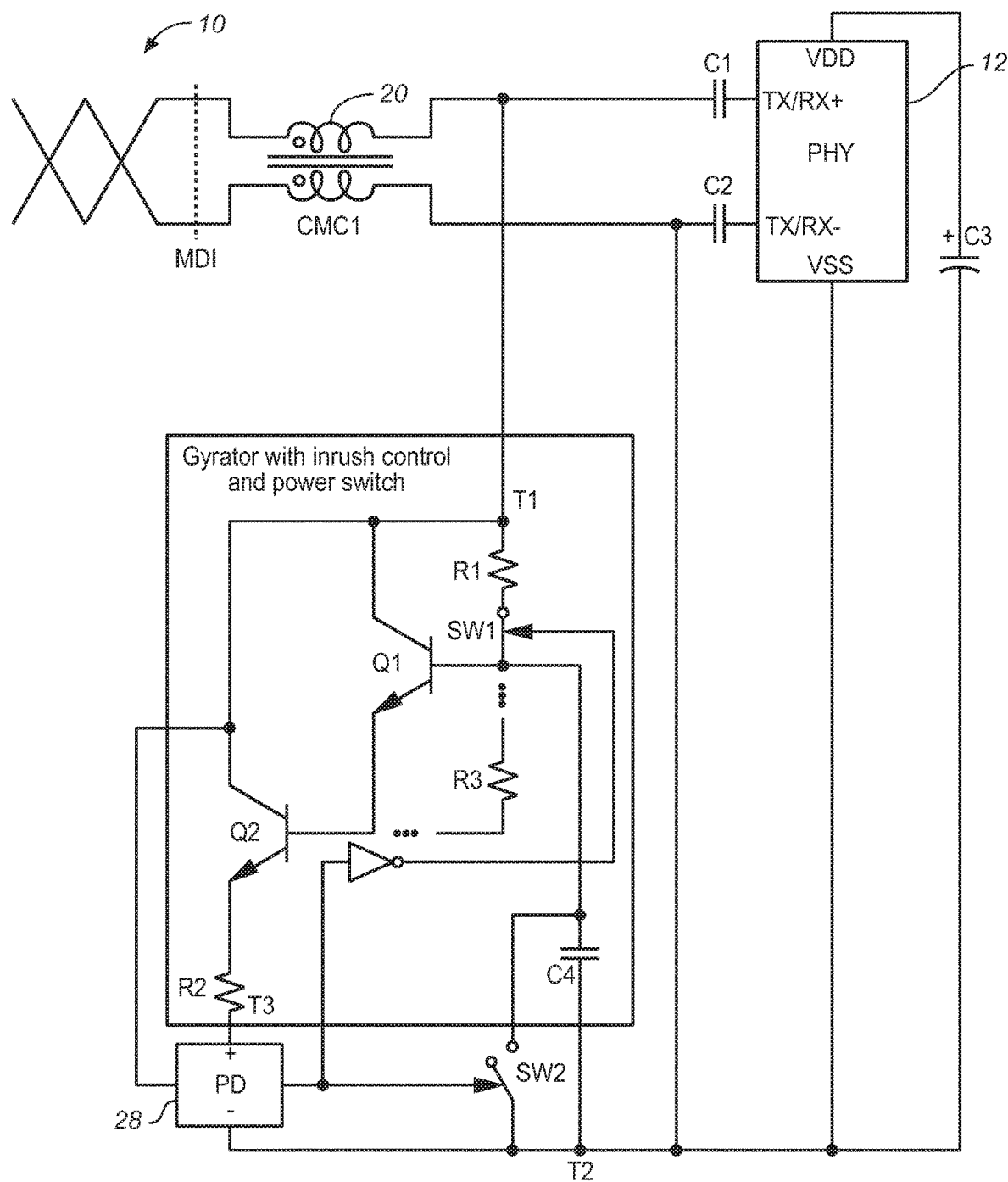

FIG. 25 illustrates a PD application where a single positive polarity NPN BJT Darlington pair gyrator is used to switch the power and limit the inrush current into the PD 28 after turn-on. The PD 28 may have a direct connection to the gyrator's T1 terminal to receive a standby voltage when the gyrator is being held off. In operation, when the PD 28 detects an adequate DC voltage from the PSE, via the wire pair 10, the PD 28 closes the switch SW1 and opens the switch SW2 to allow normal operation of the gyrator.

Figure 26:
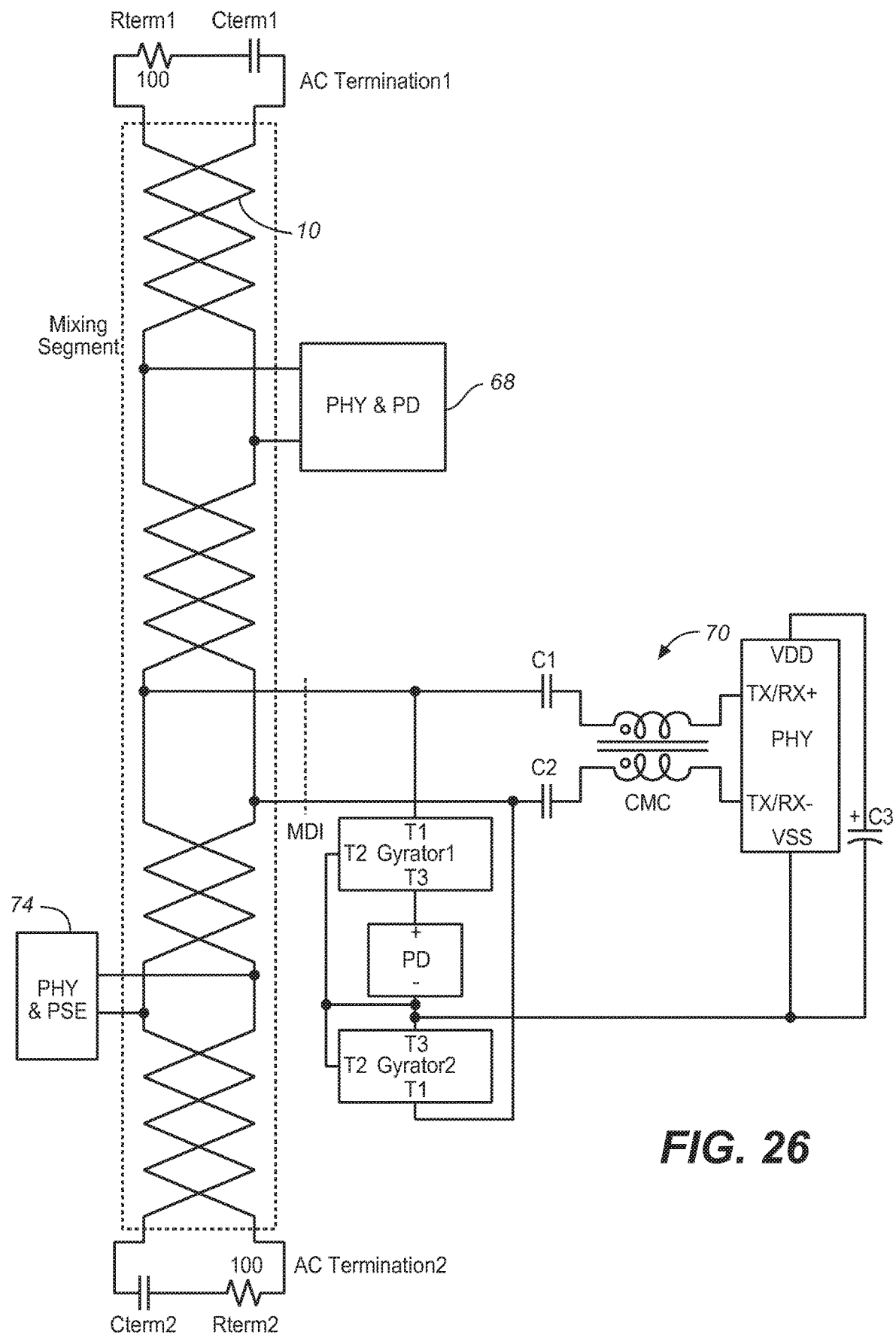
FIG. 26 illustrates another embodiment being used with multi-drop PHY/PDs connected to a mixing segment, the mixing segment being AC terminated with 100 Ohms at either end.

FIG. 26 illustrates another embodiment with multi-drop PHY/PDs 68 and 70 connected to a mixing segment, the mixing segment being AC terminated with 100 Ohms at either end. The PHY/PDs 68 and 70 may be identical, where the PHY/PD 70 is shown in more detail. A PHY/PSE 74 supplies DC power on the wire pair. Any gyrator configuration may be used in the PDs and PSE, and the gyrator configuration used in FIG. 18 is provided as an example. In this multi-drop use case, the PHYs are designed to present a high-impedance at the MDI so as to not load down the wire pair.

Figure 27:
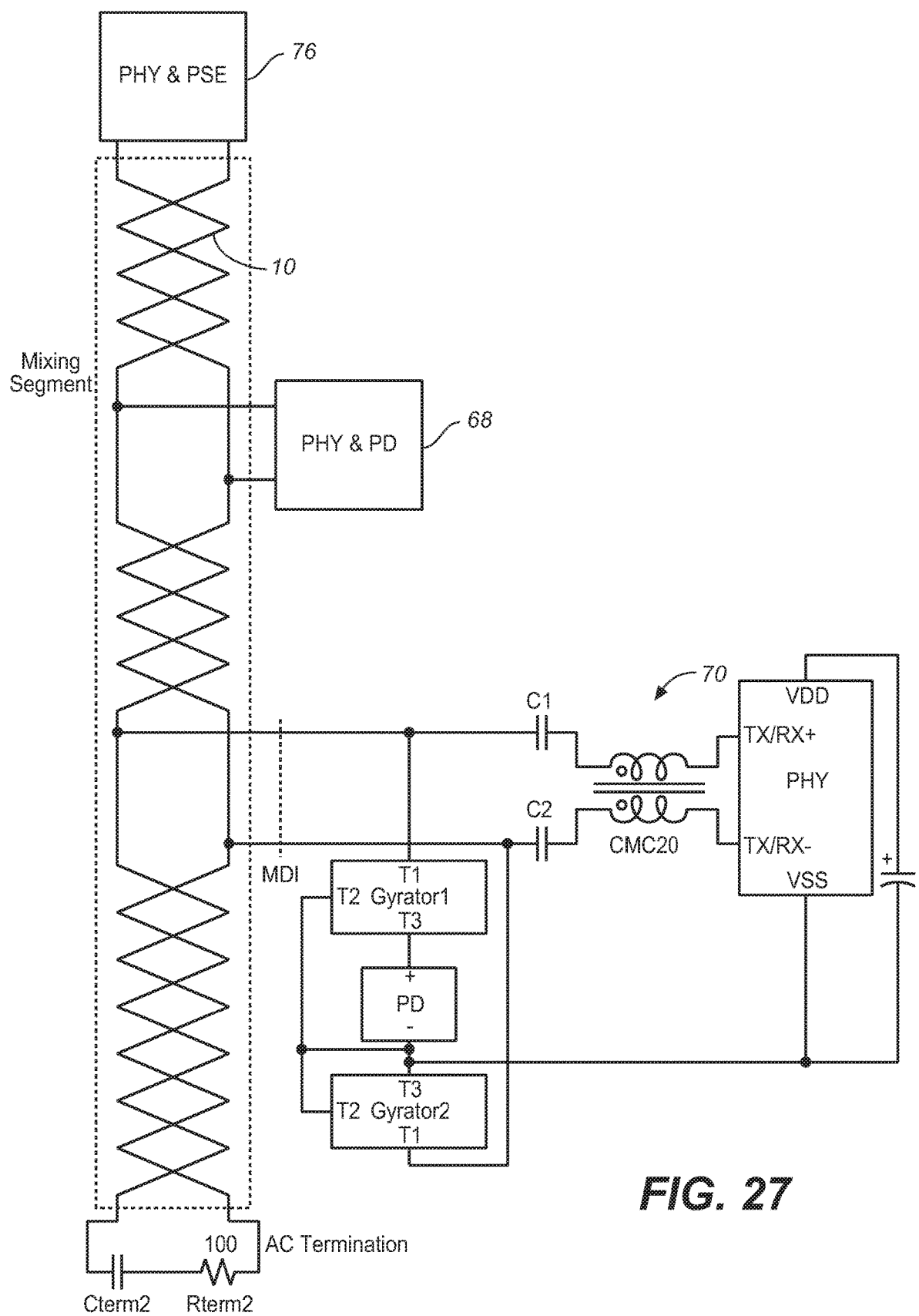
FIG. 27 illustrates another multi-drop embodiment where the first AC termination is merged with the PHY/PSE, the PHY/PSE being located at one end of the mixing-segment.

FIG. 27 illustrates another multi-drop embodiment where the PHY/PSE 76 is located at one end of the mixing-segment, and one of the 100 Ohm AC terminations is merged with the PHY/PSE 76.

The terms gyrator and active inductor mean the same thing in the context of this specification, where the gyrator emulates the impedance vs. frequency characteristics of an inductor using circuitry that can be fabricated on an IC.

Any of the disclosed features may be combined for a particular application.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A Power over Data Lines (PoDL) circuit for connection to a first conductor and a second conductor comprising:
    a first transceiver having a first terminal and a second terminal, the first transceiver for transmitting differential data signals over the first conductor and the second conductor and receiving differential data signals from the first conductor and the second conductor;
    a first AC-coupling device coupled in series between the first terminal and the first conductor;
    a second AC-coupling device coupled in series between the second terminal and the second conductor;
    a common mode choke (CMC) coupled in series between the first AC-coupling device and the first conductor, and coupled in series between the second AC-coupling device and the second conductor;
    a DC power source having a third terminal and a fourth terminal; and
    a first gyrator formed in an integrated circuit (IC) and including a capacitor coupled to a transistor of the first gyrator, the first gyrator being coupled between the third terminal of the DC power source and the first conductor with the capacitor of the first gyrator coupled to the third terminal of the DC power source.

2. The circuit of claim 1 wherein the first gyrator is coupled between the first transceiver and the CMC.

3. The circuit of claim 1 wherein the first gyrator is coupled between the CMC and the first conductor.

4. The circuit of claim 1 wherein the first gyrator presents a high impedance to the differential data signals and a low impedance to DC current.

5. The circuit of claim 1 wherein the first gyrator comprises:
    a Darlington pair of bipolar transistors, comprising a first transistor and a second transistor;
    a collector of the first transistor being coupled to a fifth terminal;
    an emitter of the second transistor being coupled to a sixth terminal through one of a resistor, an inductor, or a resistor in series with an inductor;
    a base of the first transistor being coupled to the fifth terminal via a first resistor;
    wherein the capacitor is coupled between the base of the first transistor and the sixth terminal; and
    one of the sixth terminal or the fifth terminal being coupled to the first conductor, depending on a polarity of the first gyrator.

6. The circuit of claim 1 wherein the first gyrator comprises:
    a MOSFET;
    a source of the MOSFET being coupled to a fifth terminal through one of a resistor, an inductor, or a resistor in series with an inductor;
    a gate of the MOSFET being coupled to a sixth terminal via a first resistor;
    wherein the capacitor is coupled between the gate and the fifth terminal; and
    one of the sixth terminal or the fifth terminal being coupled to the first conductor, depending on a polarity of the first gyrator.

7. The circuit of claim 1 further comprising a second gyrator, the second gyrator being coupled between the fourth terminal of the DC power source and the second conductor.

8. The circuit of claim 7 wherein the first gyrator and the second gyrator are of opposite polarities.

9. The circuit of claim 8 wherein a fifth terminal of the first gyrator is coupled to a sixth terminal of the second gyrator so that the first gyrator and the second gyrator share a common capacitance.

10. The circuit of claim 1 further comprising an inductor coupled between the first gyrator and the first conductor.

11. The circuit of claim 1 wherein the first gyrator is formed on the same IC as control circuitry for coupling DC power between the DC power source and a powered device coupled to the first conductor and the second conductor.

12. The circuit of claim 11 wherein the IC further includes an overcurrent limit circuit.

13. The circuit of claim 1 wherein the fourth terminal of the DC power source is directly coupled between the CMC and the second AC-coupling device.

14. The circuit of claim 1 wherein the fourth terminal of the DC power source is directly coupled between the CMC and the second conductor.

15. The circuit of claim 1 wherein the first conductor and the second conductor form a twisted wire pair for Ethernet data signals.

16. The circuit of claim 1 further comprising a powered device (PD) coupled to the first conductor and the second conductor for receiving power from the DC power source via the first conductor and the second conductor, the PD including a second gyrator for coupling the DC power to the PD.

17. A method performed by a Power over Data Lines (PoDL) circuit comprising:
    providing DC power and differential data over a first conductor and a second conductor;
    transmitting differential data signals over the first conductor and the second conductor and receiving differential data signals from the first conductor and the second conductor by a first transceiver having a first terminal and a second terminal;
    blocking DC voltage by a first AC-coupling device coupled in series between the first terminal and the first conductor;
    blocking the DC voltage by a second AC-coupling device coupled in series between the second terminal and the second conductor;
    attenuating common mode noise by a common mode choke (CMC) coupled in series between the first AC-coupling device and the first conductor, and coupled in series between the second AC-coupling device and the second conductor;
    supplying DC power by a DC power source having a third terminal and a fourth terminal; and
    attenuating the differential data signals and passing the DC power by a first gyrator formed in an integrated circuit (IC) and including a capacitor coupled to a transistor of the first gyrator, the first gyrator being coupled between the third terminal of the DC power source and the first conductor with the capacitor coupled to the third terminal of the DC power source.

18. The method of claim 17 further comprising:
    attenuating the differential data signals and passing the DC power by a second gyrator that has impedance vs. frequency characteristics that generally emulate an inductor, wherein the second gyrator is formed in an integrated circuit (IC), the second gyrator being coupled between the fourth terminal of the DC power source and the second conductor.

19. The method of claim 18 wherein the first gyrator and second gyrator are of opposite polarities.

20. The method of claim 17 wherein the fourth terminal of the DC power source is directly coupled between the CMC and the second conductor.

* * * * *